(12) United States Patent
Noguchi

(10) Patent No.: US 8,493,099 B2
(45) Date of Patent: Jul. 23, 2013

(54) SAMPLE AND HOLD CIRCUIT AND METHOD FOR CONTROLLING SAME

(75) Inventor: Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 170 days.

(21) Appl. No.: 13/060,991

(22) PCT Filed: Sep. 15, 2009

(86) PCT No.: PCT/JP2009/066096
§ 371 (c)(1),
(2), (4) Date: Feb. 25, 2011

(87) PCT Pub. No.: WO2010/032727
PCT Pub. Date: Mar. 25, 2010

(65) Prior Publication Data
US 2011/0163899 A1    Jul. 7, 2011

(30) Foreign Application Priority Data
Sep. 17, 2008    (JP) .................................. 2008-238198

(51) Int. Cl.
*G11C 27/02*    (2006.01)
*H03K 5/00*    (2006.01)
*H03K 17/00*    (2006.01)

(52) U.S. Cl.
USPC ........................................................... 327/94

(58) Field of Classification Search
USPC ................... 327/91, 94–97; 341/122–125
See application file for complete search history.

(56) References Cited

U.S. PATENT DOCUMENTS

| 4,806,790 A * | 2/1989 | Sone ................................ 327/94 |
| 6,937,174 B2 | 8/2005 | Higashi et al. |
| 7,248,082 B2 * | 7/2007 | Nakasha et al. ................ 327/91 |
| 7,782,096 B2 * | 8/2010 | Corsi et al. ....................... 327/91 |
| 2010/0328509 A1 | 12/2010 | Yamashita et al. |
| 2011/0156759 A1* | 6/2011 | Noguchi ......................... 327/94 |

FOREIGN PATENT DOCUMENTS

| JP | 57-50394 A | 3/1982 |
| JP | 4-125900 A | 4/1992 |
| JP | 6-177710 A | 6/1994 |
| JP | 9-130168 A | 5/1997 |
| JP | 2002368592 A | 12/2002 |
| JP | 2004-158138 A | 6/2004 |
| JP | 2006157648 A | 6/2006 |
| JP | 2008-5005 A | 1/2008 |
| JP | 2008-136239 A | 6/2008 |

OTHER PUBLICATIONS

International Search Report for PCT/JP2009/066096 mailed Oct. 27, 2009.
Japanese Office Action for JP 2010-529763 mailed on May 21, 2013 with Partial English Translation.

* cited by examiner

*Primary Examiner* — Quan Tra

(57) ABSTRACT

A sample and hold circuit that is provided with an input stage amplifier circuit for amplifying an input signal and a hold circuit for holding an output signal of the input stage amplifier circuit, with a sampling clock signal as a trigger, is further provided with a hold circuit bias current switching circuit for switching a bias current of the hold circuit to a first separate circuit that is functionally independent of the sample and hold circuit, in a case where the hold circuit is in a hold period, to supply the bias current to the circuit.

8 Claims, 9 Drawing Sheets

SAMPLE AND HOLD CIRCUIT AND METHOD FOR CONTROLLING SAME

DESCRIPTION OF RELATED APPLICATION

The present invention is the National Phase of PCT/JP2009/066096, filed Sep. 15, 2009, which is based upon and claims the benefit of the priority of Japanese Patent Application No. 2008-238198 (filed on Sep. 17, 2008), the disclosure of which is incorporated herein in its entirety by reference thereto.

TECHNICAL FIELD

The present invention relates to a sample and hold circuit and a method for controlling the circuit, and in particular to a current switching source-follower type of sample and hold circuit and a method for controlling the circuit.

BACKGROUND

In sample and hold circuits used in analog digital converters and the like, which handle high speed signals, a current switching source-follower type of sample and hold circuit is frequently used.

FIG. 6 shows a first conventional example of a current switching source-follower type of sample and hold circuit (refer to FIG. 8 etc. of Patent Document 2). This sample and hold circuit is configured from an input stage amplifier circuit 11 for amplifying a differential voltage of input signals IN and INB by a prescribed amplification rate, a current switching source-follower type of hold circuit 2 for holding an analog output voltage of the input stage amplifier circuit 11, and an output buffer 3 for buffering output of the hold circuit 2.

The input stage amplifier circuit 11 is provided with NMOS transistors Tr11 and Tr12, and resistor elements R11 to R14. The NMOS transistor Tr11 has a drain connected to a power supply VDD via the resistor element R11, a source connected to a power supply I11 via the resistor element R13, and a gate that is given the input signal IN. The NMOS transistor Tr12 has a drain connected to the power supply VDD via the resistor element R12, a source connected to the power supply I11 via the resistor element R14, and a gate that is given the input signal INB of a reverse phase to the input signal IN. This type of input stage amplifier circuit 11 is configured as an input stage differential amplifier circuit, and amplifies a differential voltage of the input signals IN and INB by a prescribed amplification rate, to be supplied to the hold circuit 2 as an output signal PREOUT from the drain of the NMOS transistor Tr12.

The hold circuit 2 is provided with NMOS transistors Tr3 to Tr5, a current source I2, and a capacitor CH for holding voltage. The NMOS transistor Tr3 has a drain connected to the power supply VDD, a source is connected to one end of the capacitor CH and a drain of the NMOS transistor Tr5, and a gate is given the output signal PREOUT. The NMOS transistor Tr4 has a drain connected to a gate of the NMOS transistor Tr3, a source is connected to a current source I2, and a gate is given a sampling clock signal CLKB. The NMOS-transistor Tr5 has a source connected to the current source I2, and a gate is given a sampling clock signal CLK of reverse phase to the sampling clock signal CLKB. In the capacitor CH, one end is given a hold signal VHOLD and another end is connected to ground.

An output buffer 3 is provided with a NMOS transistor Tr6 and a resistor element R5. The NMOS transistor Tr6 has a drain connected to the power supply VDD, an output signal OUT is outputted from a source, together with the source being connected to ground via the resistor element R5, and a gate is connected to the one end of the capacitor CH.

Operation of a sample and hold circuit is described making reference to a timing chart of FIG. 7. First, when the sampling clock signal CLK is at a HIGH level (CLKB is at a LOW level), the input stage amplifier circuit 11 operates simply as a linear amplifier circuit, and outputs a voltage proportional to differential voltage of the input voltages IN and INB as an output signal PREOUT. Furthermore, in the hold circuit 2, since a current from the current source I2 flows to the NMOS transistor Tr5 side, the NMOS transistor Tr3 operates as simply a source-follower, and while charging the capacitor CH, outputs a voltage in accordance with the output signal PREOUT, as a hold signal. VHOLD. The output buffer 3 receives the hold signal VHOLD at high impedance, and, as an output signal OUT, outputs a voltage according to the holding signal VHOLD as an output signal OUT. That is, when the sampling clock signal CLK is at a HIGH level (CLKB is at a LOW level), the sample and hold circuit performs a sample operation as simply an amplifier, and outputs the output signal OUT following an input signal.

On the other hand, when the sampling clock signal CLK is at a LOW level (CLKB is at a HIGH level), with the NMOS transistor Tr5 OFF, the current of the current source I2 flows in the resistor element R12 of the input stage amplifier circuit 11 of a front stage via the NMOS transistor Tr4. Therefore, with regard to the resistor element R12, a voltage drop of R12×I2 occurs at a connection point with a gate of the NMOS transistor Tr3, potential of the output signal PREOUT drops, and the NMOS transistor Tr3 is OFF. (Note that I2>I11 is necessary in order that Tr3 is not ON even if maximum input is applied. With this condition, with regard to the potential of the output signal PREOUT, Tr3 is always in an OFF state according to the voltage drop of R12×I2.) In this way, the capacitor CH is separated from the NMOS transistor Tr3. However, a charge immediately before the sampling clock signal CLK switches from a HIGH level to a LOW level, is held in the capacitor CH. Therefore, potential of the hold signal VHOLD is held, and a voltage at an instant at which the sampling clock signal changes from a HIGH level to a LOW level, is outputted from the output buffer 3 (hold operation).

In this way, the conventional sample and hold circuit operates as a simple amplifier when the sampling clock signal CLK has a HIGH level, and when the sampling clock signal CLK has a LOW level, operates as a hold circuit for holding the voltage at the instant the sampling clock signal CLK changes from a HIGH level to a LOW level.

However, in the first conventional example, the input stage amplifier circuit 11 operates during the hold period and causes the gate potential (PREOUT) of the NMOS transistor Tr3, which is a source follower of the hold circuit 2, to waver. As described above, normally, according to the current of the current source I2 flowing via the NMOS transistor Tr4 and the voltage drop due to the load resistor (R12) of the input stage amplifier circuit 11, the potential of the output signal PREOUT is set to be low so that the NMOS transistor Tr3 is OFF (I2>I11). As a result, the NMOS transistor Tr3 is always in an OFF state. However, since the wavering of the output signal PREOUT leaks into the hold signal VHOLD, due to parasitic capacitance between the gate and source of the NMOS transistor Tr3, and the hold signal VHOLD is varied, there has been a problem in that the input signal leaks (feeds through) to output.

As a means of solving this feed-through problem, a second conventional example shown in FIG. 8 is disclosed (refer to FIG. 2 etc. of Patent Document 1). In this conventional example, a current bypass circuit 5 is further provided, and by using a bypass transistor TrBp forming the current bypass circuit 5 during a hold period, a bias current (current of a current source I11) of the input stage amplifier circuit 11 is bypassed to the power supply VDD. By the bypass of the bias current (I11), the NMOS transistors Tr11 and Tr12 that form an input stage differential pair are OFF, and feed-through is suppressed by arranging such that an input signal is not transmitted to the hold circuit 2 of a subsequent stage.

Furthermore, as another means of suppressing feed-through, a third conventional example shown in FIG. 9 is disclosed (refer to FIG. 2 etc. of Patent Document 2). With regard to the sample and hold circuit of FIG. 6, a circuit in this case is further provided with a bias current switching circuit 14 having NMOS transistors Tr17 and Tr18 as a differential pair, and a constant voltage supply circuit 16 having NMOS transistors Tr9 and Tr10 as a differential pair. During a hold period, by the bias current switching circuit 14, a bias current (current of the current source I1) of the input stage amplifier circuit 11 is bypassed to the constant voltage supply circuit 16 to which a constant voltage (HIGH/LOW) is applied. By the bypass of the bias current, the feed-through is suppressed by supplying a constant voltage such that an NMOS transistor Tr3 is OFF, to the hold circuit 2.

[Patent Document 1]
JP Patent Kokai Publication No. JP-H09-130168A
[Patent Document 2]
JP Patent Kokai Publication No. JP2006-157648A

SUMMARY

It is to be noted that the entire disclosures of the above-mentioned patent documents are incorporated herein by reference thereto. The following analysis is given by the present invention.

In the second and third conventional examples, however, during a hold period, in order that a NMOS transistor Tr3 forming a source follower of a hold circuit 2 be completely OFF, there is a constraint of I2>I11 between a current of a bias current source I2 and a current of a bias current source I11. Therefore, it is necessary to continue to flow a current of the bias current source I2 during the hold period. That is, there has been a problem in that the current of the bias current source I2 on a hold circuit side that is not involved in a hold operation during the hold period is wastefully consumed, and power efficiency is in inferior.

Therefore, it is an object of the present invention to provide a sample and hold circuit of good power efficiency by reducing wastefully consumed current during the hold period, and to provide a method for controlling the circuit.

According to a first aspect of the present invention, a sample and hold circuit is provided with: an input stage amplifier circuit for amplifying an input signal, and a hold circuit for holding an output signal of the input stage amplifier circuit with a sampling clock signal as a trigger, wherein the sample and hold circuit is provided with a first bias current switching circuit for switching a bias current of the hold circuit to a first other circuit that is functionally independent of the sample and hold circuit, in a case where the hold circuit is in a hold period, to supply the current to the first other circuit.

According to another aspect of the present invention, there is provided a method for controlling a sample and hold circuit that includes: an input stage amplifier circuit for amplifying an input signal, and a hold circuit for holding an output signal of the input stage amplifier circuit with a sampling clock signal as a trigger, wherein control is performed so as to switch a bias current of the hold circuit to a first other circuit that is functionally independent of the sample and hold circuit, in a case where the hold circuit is in a hold period, to supply the current to the first other circuit.

According to the present invention, it is possible to improve power efficiency by reducing wasteful current consumption during a hold period.

PREFERRED MODES

Figure 1:
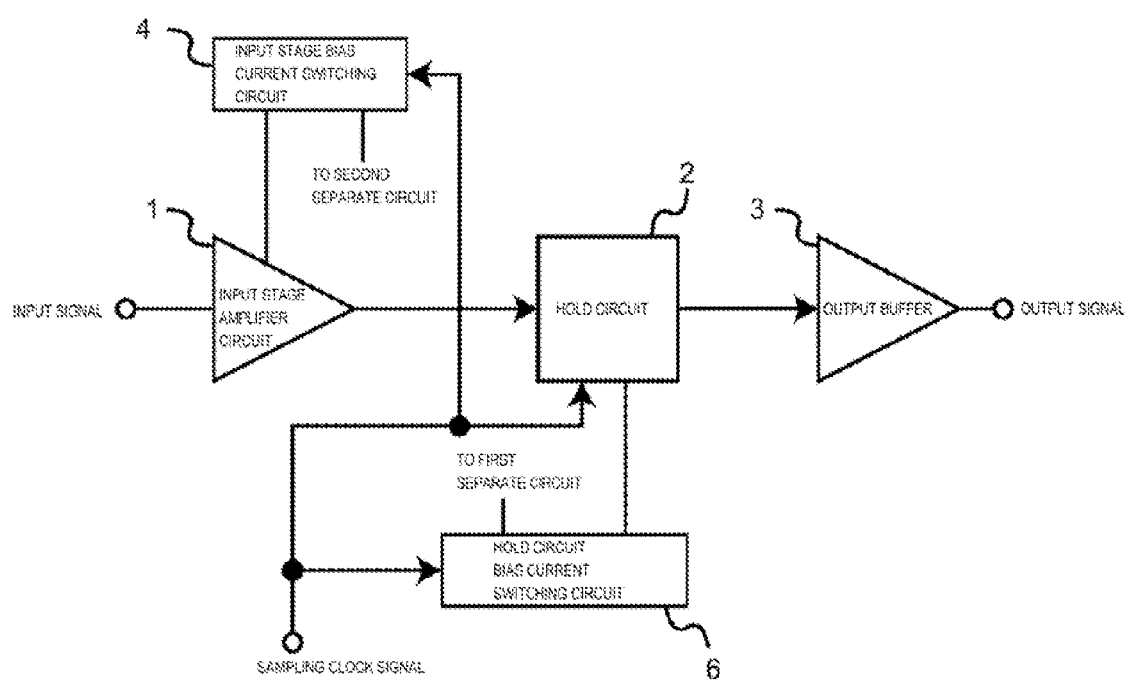
FIG. 1 is a block diagram showing a configuration of a sample and hold circuit according to an embodiment of the present invention.

A sample and hold circuit according to an embodiment of the present invention is provided with: an input stage amplifier circuit for amplifying an input signal, and a hold circuit for holding an output signal of the input stage amplifier circuit with a sampling clock signal as a trigger, wherein the sample and hold circuit is further provided with a first bias current switching circuit for switching a bias current of the hold circuit to a first other circuit that is functionally independent of the sample and hold circuit, in a case where the hold circuit is in a hold period, to supply the current to the first other circuit.

The sample and hold circuit of the present invention may be arranged such that two systems of the abovementioned sample and hold circuit are provided; when one of the two systems is in a sample period, a time interleaving operation is performed with the other of the two systems in a hold period, one bias current source for an input stage differential amplifier circuit is provided to be shared by input stage differential amplifier circuits of both the sample and hold circuits, a second bias current switching circuit switches and supplies a current so as to flow a bias current to the other of the input stage differential amplifier circuits when one of the systems is in a hold period, one bias current source for a hold circuit is provided to be shared by hold circuits of both the sample and hold circuits, and a first bias current switching circuit switches and supplies a current, when one of the systems is in a hold period, so as to flow a bias current to the other hold circuit.

The sample and hold circuit of the present invention may be arranged such that a plurality of the abovementioned sample and hold circuits are provided, with each of the sample and hold circuits being made to perform a time interleaving operation, a single bias current source for a hold circuit being provided to be shared as a bias current source of each of the hold circuits that perform an interleaving operation, and the first bias current switching circuit switches bias current in a time-wise manner with respect to the bias current source for a hold circuit, to be supplied as a bias current of each of the hold circuits.

The sample and hold circuit of the present invention may be arranged such that a plurality of the abovementioned sample and hold circuits are provided, with each of the sample and hold circuits being made to perform a time interleaving operation, and a single bias current source for an input stage amplifier circuit being provided to be shared as a bias current source of each of the input stage amplifier circuits that perform an interleaving operation, wherein a single bias current source for a hold circuit is provided to be shared as a bias current source of each of the hold circuits that perform an interleaving operation, the first bias current switching circuit switches bias current in a time-wise manner with respect to the bias current source for the hold circuits, to be supplied as a bias current of each of the hold circuits, and a second bias current switching circuit switches bias current in a time-wise manner with respect to the bias current source for an input stage amplifier circuit, to be supplied as a bias current of each of the input stage amplifier circuits.

The sample and hold circuit of the present invention may be further provided with a second bias current switching circuit for switching a bias current of an input stage amplifier circuit to a second other circuit that is functionally independent of the sample and hold circuit, in a case where the hold circuit is in a hold period, to supply the bias current to the second other circuit.

The sample and hold circuit of the present invention may be arranged such that two systems of the abovementioned sample and hold circuit are provided, wherein when one of the two systems is in a sample period, a time interleaving operation is performed with the other of the two systems in a hold period, one bias current source for a hold circuit is provided to be shared by hold circuits of both of the sample and hold circuits, and a first bias current switching circuit, when one of the systems is in a hold period, switches and supplies a current so as to flow a bias current to the other hold circuit.

The sample and hold circuit of the present invention may be arranged such that the hold circuit is configured by a source follower of a first conductive type transistor, and the first bias current switching circuit is configured by a current switching differential pair of a first conductive type transistor arranged between the source follower and a bias current source thereof.

The sample and hold circuit of the present invention may be arranged such that the input stage amplifier circuit is configured by an input stage differential amplifier circuit by a differential pair of a second conductive type transistor, the second bias current switching circuit is configured by a current switching differential pair of a second conductive type transistor arranged between the input stage differential amplifier circuit and a bias current source thereof, the hold circuit is configured by a source follower of a first conductive type transistor, and the first bias current switching circuit is configured by a current switching differential pair of a first conductive type transistor arranged between the source follower and a bias current source thereof.

FIG. 1 is a block diagram showing a configuration of the sample and hold circuit according to an embodiment of the present invention. In FIG. 1, the sample and hold circuit is provided with an input stage amplifier circuit 1 for amplifying an input signal by a prescribed amplification rate, a hold circuit 2 for receiving an output of the input stage amplifier circuit 1 and holding an output voltage of the input stage amplifier circuit 1 with a sampling clock signal as a trigger, and an output buffer 3 for buffering output of the hold circuit 2. Furthermore, there is provided a hold circuit bias current switching circuit 6 (first bias current switching circuit) in which a bias current of the hold circuit 2 can be switched to a first other circuit (referred to below as a separate circuit or separate circuit block) that is functionally independent of this sample and hold circuit. Furthermore, there is provided an input stage bias current switching circuit 4 (second bias current switching circuit) in which a bias current of the input stage amplifier circuit 1 can be switched to a second other circuit (referred to below as a separate circuit or separate circuit block) that is functionally independent of this sample and hold circuit. The input stage amplifier circuit 1 uses an amplifier circuit of a type in which when a bias current thereof is interrupted, output thereof decreases to a GND potential, for example.

The input stage bias current switching circuit 4 turns the input stage amplifier circuit 1 OFF by switching the bias current of the input stage amplifier circuit 1 to the second separate circuit during a hold period in which an output voltage of the input stage amplifier circuit 1 is held, and also supplies this switched bias current to the second separate circuit. Since by this bias current switching, the input stage amplifier circuit 1 is in an OFF state during a hold period and an input signal is not transmitted to the hold circuit 2, it is possible to suppress feed-through. Furthermore, at the same time, by the switched bias current being effectively used in the second separate circuit block, it is possible to eliminate wasteful current consumption.

Furthermore, in the sample and hold circuit of the present embodiment, since during a hold period the output of the input stage amplifier circuit 1, that is, the input of the hold circuit 2 decreases to GND potential for example, the hold circuit 2 is in an OFF state. Therefore, during the hold period the bias current of the hold circuit 2 is no longer necessary. As a result, by switching the current during the hold period so that the bias current of the hold circuit 2 is also effectively used in the first separate circuit block, wasteful current can be further reduced, and it is possible to further raise power efficiency.

In addition, an implementation may be made of an interleave type sample and hold circuit where a bias current of a hold circuit and an input stage amplifier circuit which is switched during a hold period is used as a bias current of a hold circuit and an input stage amplifier circuit of another sample and hold circuit that is separately provided, and by performing an interleaving operation by mutually reverse phase sampling clock signals CLK, wasteful current consumption is eliminated and efficiency is good. That is, with respect to the input stage amplifier circuit and the hold circuit of two sample and hold circuits that perform a time interleaving operation, by alternately sharing, in a time-wise manner, single common bias current sources of each, it is possible to realize reduced power and elimination of bias current during a hold period, which flows wastefully in conventional cases.

In a case where a sample and hold circuit has an interleave configuration, the number of sample and hold circuits that perform interleaving is not limited to two. That is, by adjusting sampling clock signal duty ratio, it is possible to share a single bias current source with three or more sample and hold circuits. Therefore, the more the number of sample and hold circuits that perform an interleaving operation is increased, the more power efficiency improves, and as a result, it is possible to realize a low power sample and hold circuit.

In this way, according to the sample and hold circuit of the present invention, by switching the bias current of the input stage amplifier circuit to the separate circuit during a hold period in which an output voltage of the input stage amplifier circuit 1 is being held, the input stage amplifier circuit 1 is turned OFF and leaking (feed-through) of an input signal to the output voltage is suppressed. Furthermore, the bias current of the input stage amplifier circuit, which has been switched, is supplied to the separate circuit. In addition, the hold circuit bias current switching circuit 6, in which the bias current of the hold circuit 2 can be switched to the separate circuit, is provided, and the bias current of the hold circuit 2 during the hold period is supplied to the separate circuit.

Furthermore, according to the present invention, a sample and hold circuit is obtained in which a plurality of the sample and hold circuits are lined up, and sampling frequency is improved by making each of them perform a time interleaving operation, a single bias current source for an input stage amplifier circuit is shared as a bias current source of input stage amplifier circuits that perform the respective interleaving operations, and the bias current is switched in a time-wise manner to be used as a bias current of each of the input stage amplifier circuits. In addition, a sample and hold circuit is obtained in which a single bias current source for a hold circuit is shared as a bias current source of each of the hold circuits that perform an interleaving operation, and the bias current is switched in a time-wise manner to be used as a bias current of each of the hold circuits.

A description is given below concerning details of the circuits according to exemplary embodiments.

First Exemplary Embodiment

Figure 2:
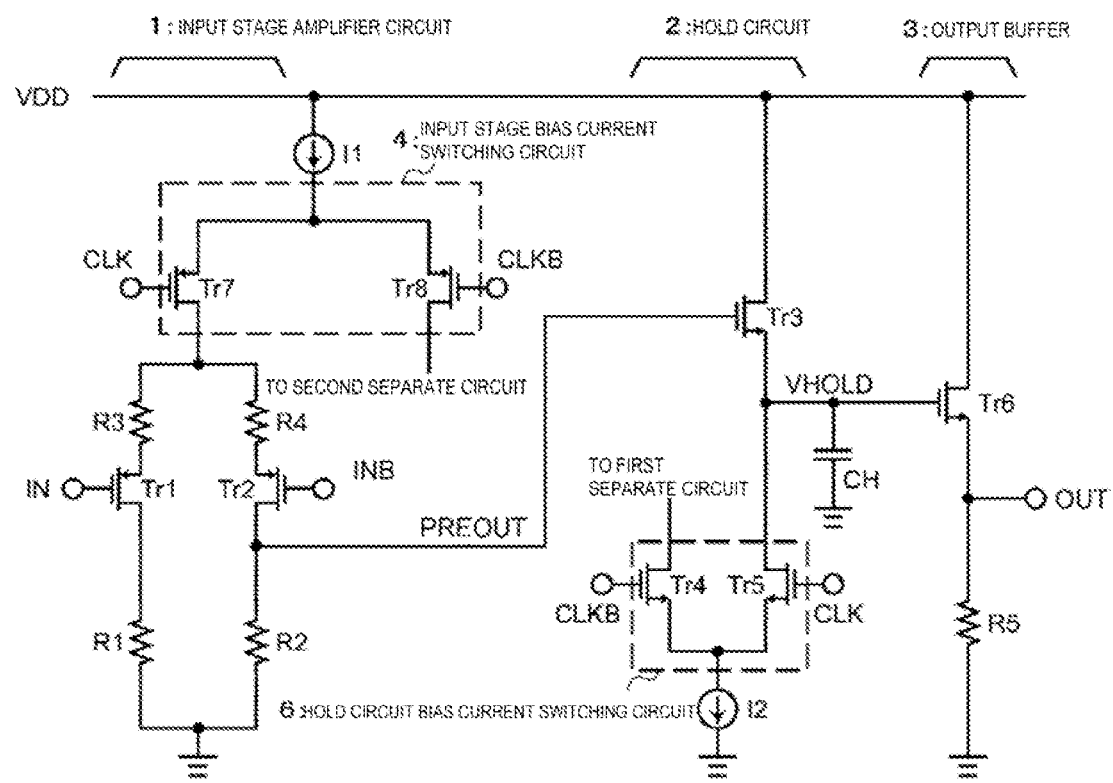
FIG. 2 is a circuit diagram of a sample and hold circuit according to a first exemplary embodiment of the present invention.
Figure 9:
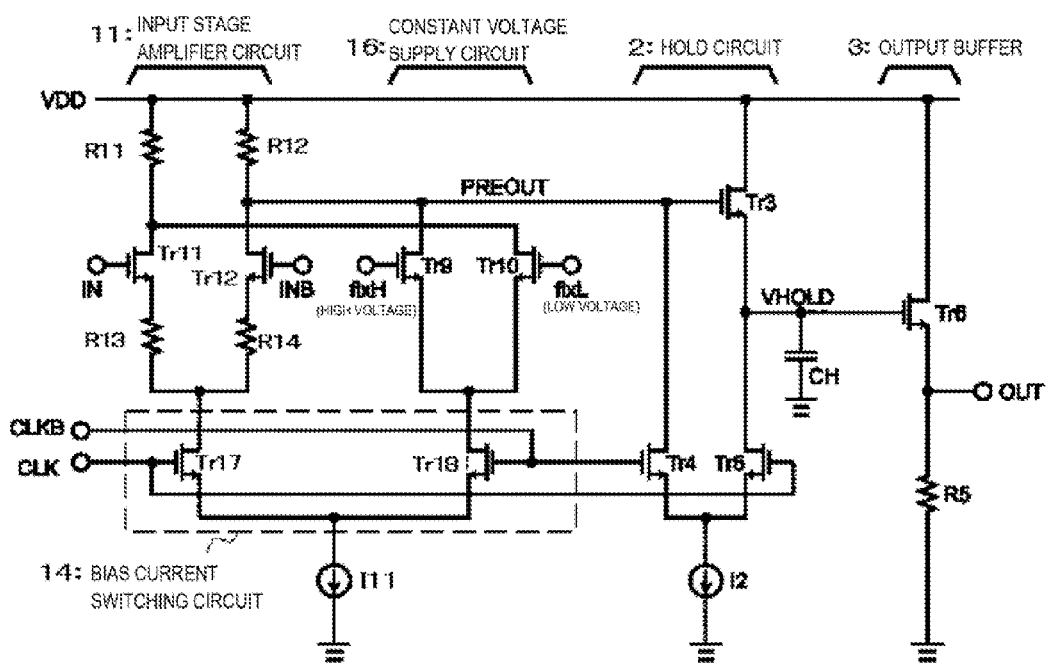
FIG. 9 is a circuit diagram of a sample and hold circuit of a third conventional example.

FIG. 2 is a circuit diagram of a sample and hold circuit according to a first exemplary embodiment of the present invention. In FIG. 2, reference symbols the same as FIG. 9 represent the same items, and descriptions thereof are omitted. In the sample and hold circuit according to the first exemplary embodiment, an input stage amplifier circuit 1 is provided with PMOS transistors Tr1 and Tr2, and resistor elements R1 to R4. Furthermore, an input stage bias current switching circuit 4 is provided with PMOS transistors Tr7 and Tr8 that form a differential pair, and sources of the PMOS transistors Tr7 and Tr8 are commonly connected to a power supply VDD via a current source I1.

In FIG. 2, the input stage amplifier circuit 1 and the input stage bias current switching circuit 4 correspond respectively to an input stage amplifier circuit 11 and an bias current switching circuit 14 of FIG. 9 and have similar configurations, but PMOS transistors are used instead of NMOS transistors, and a connection relationship of a power supply VDD and ground is interchanged with regard to FIG. 9. Furthermore, a differential pair (Tr9 and Tr10) for giving a constant input voltage shown in FIG. 9 is removed, and a bias current switched by the PMOS transistor Tr8 is bypassed, as it is, as a current to a second separate circuit block. In addition, a bias current switched by the NMOS transistor Tr4 in a hold circuit bias current switching circuit 6 is bypassed, as it is, as a current of a first separate circuit block.

Figure 3:
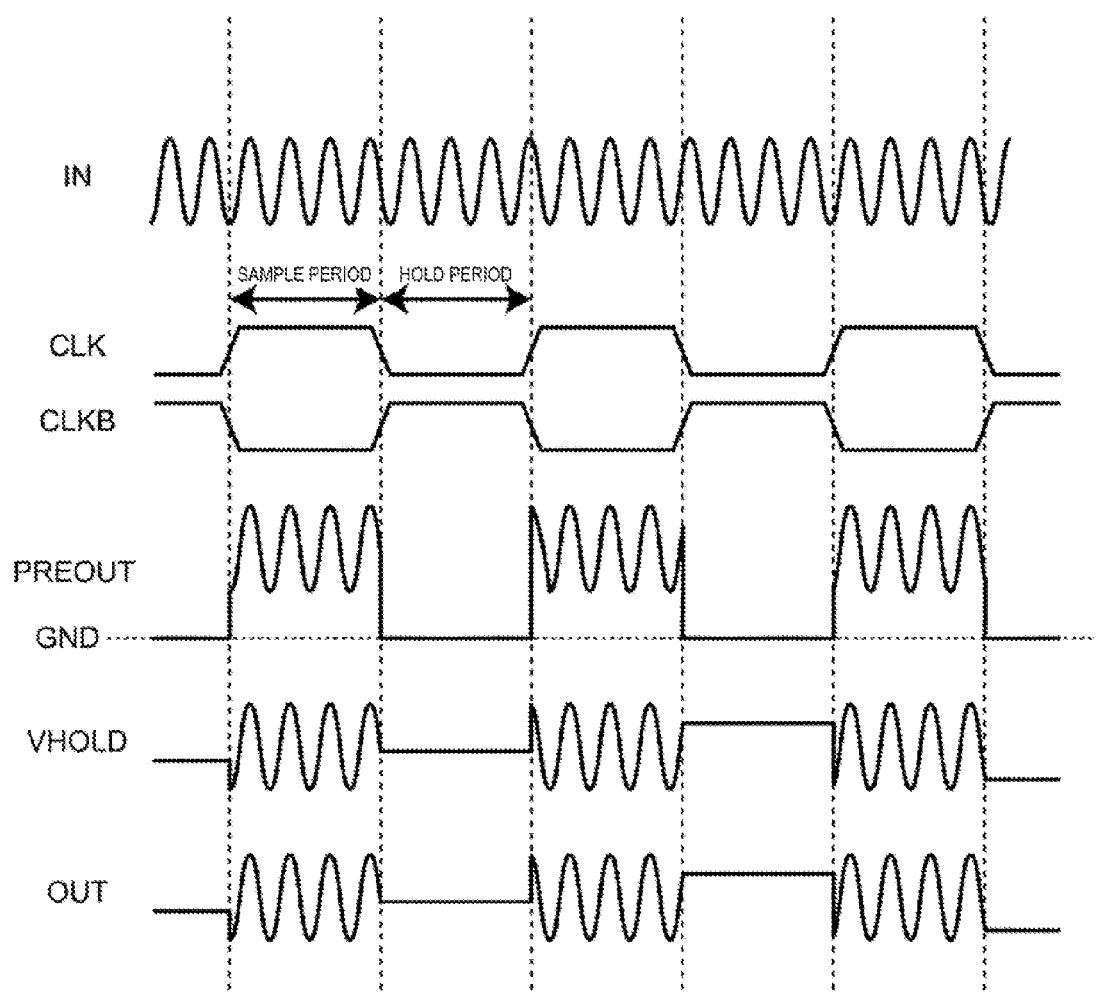
FIG. 3 is a timing chart representing operation of the sample and hold circuit according to the first exemplary embodiment of the present invention.

Next, operation of the sample and hold circuit of the present exemplary embodiment is described using a timing chart shown in FIG. 3. When a sampling clock signal CLK is at a HIGH level, a current of the bias current source I1 flows to a Tr7 side. Therefore, the input stage amplifier circuit 1 turns ON and operates as a PMOS differential amplifier circuit. A differential voltage between input signals IN and INB is amplified by a prescribed amplification rate, and an output signal PREOUT is transmitted to a hold circuit 2 of a subsequent stage.

Furthermore, with regard to the hold circuit 2, since a current of a current source I2 flows to a Tr5 side, Tr3 operates as a source follower, receives an output signal PREOUT, and charges a capacitor CH in addition to outputting a hold signal VHOLD in response to the output signal PREOUT. An output buffer 3 operates as a buffer of the source follower, the hold signal VHOLD, which is the output voltage of the hold circuit 2, is received, and is received at a high impedance and buffered, and an output signal OUT is outputted.

In this way when the sampling clock CLK is at a HIGH level, operation is in sampling mode, and a voltage in response to an input signal is outputted as the output signal OUT.

On the other hand, when the sampling clock signal CLK is at a LOW level, the sample and hold circuit of the present exemplary embodiment operates in a hold mode, and a voltage at an instant at which the sampling clock signal CLK changes from a HIGH level to a LOW level is held. That is, Tr5 turns OFF at the instant at which the sampling clock signal CLK changes from a HIGH level to a LOW level, and a drive current of Tr3, which forms a source follower, is cut. On the other hand, with regard to Tr7 and Tr8, which are a bias current switching differential pair, a Tr8 side is ON. Therefore, a bias current is not supplied to a PMOS input stage differential amplifier and is OFF, and the bias current I1 is bypassed to a separate circuit via Tr8. At the same time, since a current does not flow to a resistor element R2, which is a drain load of the PMOS input stage differential amplifier circuit, a potential of the output signal PREOUT drops to a GND potential. Thus, Tr3 that forms a source follower of the hold circuit 2 of a subsequent stage is OFF, and a capacitor CH for holding voltage is separated from Tr3. At this time, since charge stored in the capacitor CH is held, when the sampling clock signal CLK is at a LOW level, a voltage at the instant the sampling clock signal has switched from a HIGH level to a LOW level is held.

In this way, by interrupting and turning OFF the bias current of the PMOS input differential amplifier circuit during a hold period, there is no leaking of the input signal to a hold circuit stage, and feed-through is suppressed. Furthermore, at the same time, conventionally, since the NMOS transistor Tr3 of the hold circuit 2 is turned OFF, there is no need for the current of the bias current source I2 of the hold circuit 2. Therefore, the current of the bias current source I2 of the hold circuit 2 that has been switched during the hold period can be effectively used in a separate circuit.

As described above, according to the sample and hold circuit of the present exemplary embodiment, while suppressing feed-through by switching each of the bias currents of the input stage amplifier circuit 1 and the hold circuit 2 during a hold period, it is possible to raise power efficiency by effectively using the switched bias current in the separate circuit, and to realize lower power.

Furthermore, in the sample and hold circuit of the present exemplary embodiment, a sample and hold circuit according to MOSFETs is shown, but application is also possible to a case of a similar circuit with bipolar transistors.

In addition, the sample and hold circuit of the present exemplary embodiment uses a combination of the input stage amplifier circuit 1 formed from a PMOS differential pair, and the hold circuit 2 that uses an NMOS source follower. However, there is no limitation to this, and clearly a combination is also possible of an input stage amplifier circuit 1 formed from an NMOS differential pair and a hold circuit 2 that uses a PMOS source follower.

Second Exemplary Embodiment

Figure 4:
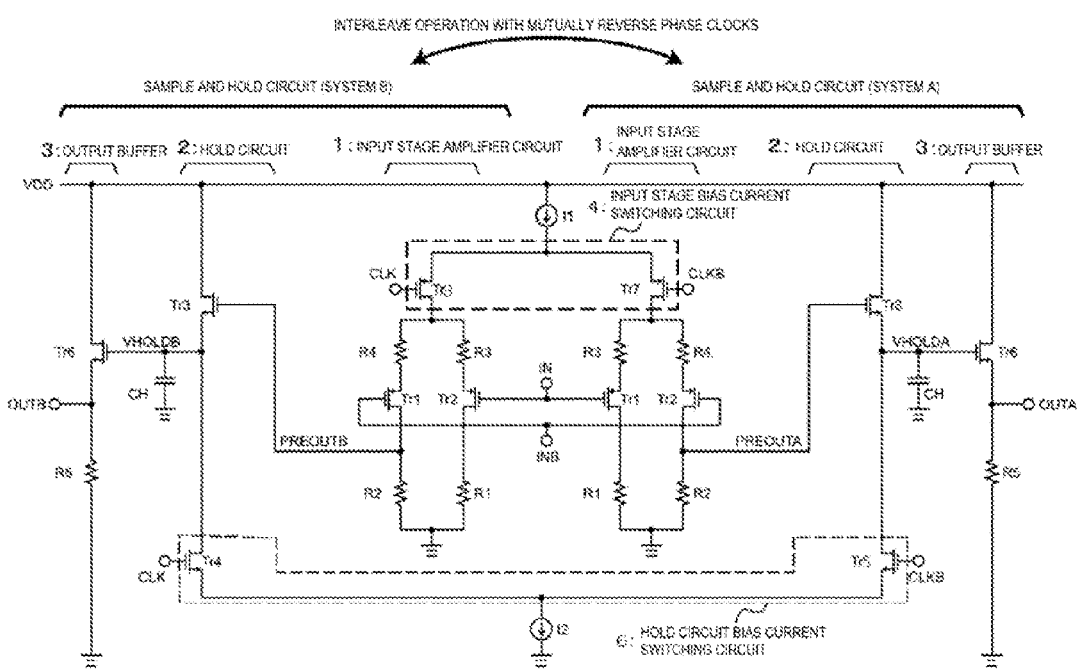
FIG. 4 is a circuit diagram of a sample and hold circuit according to a second exemplary embodiment of the present invention.
Figure 5:
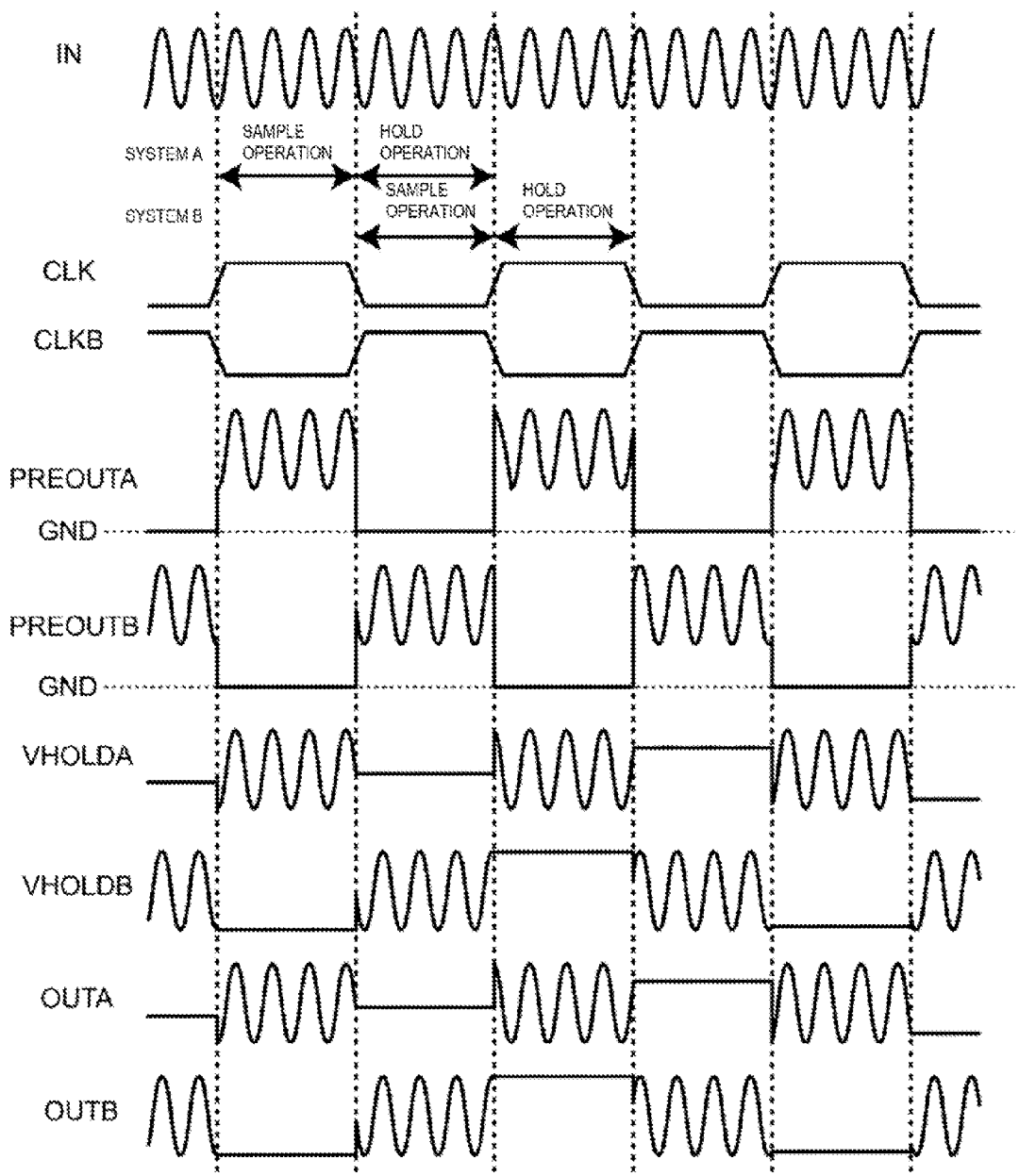
FIG. 5 is a timing chart representing operation of the sample and hold circuit according to the second exemplary embodiment of the present invention.
Figure 6:
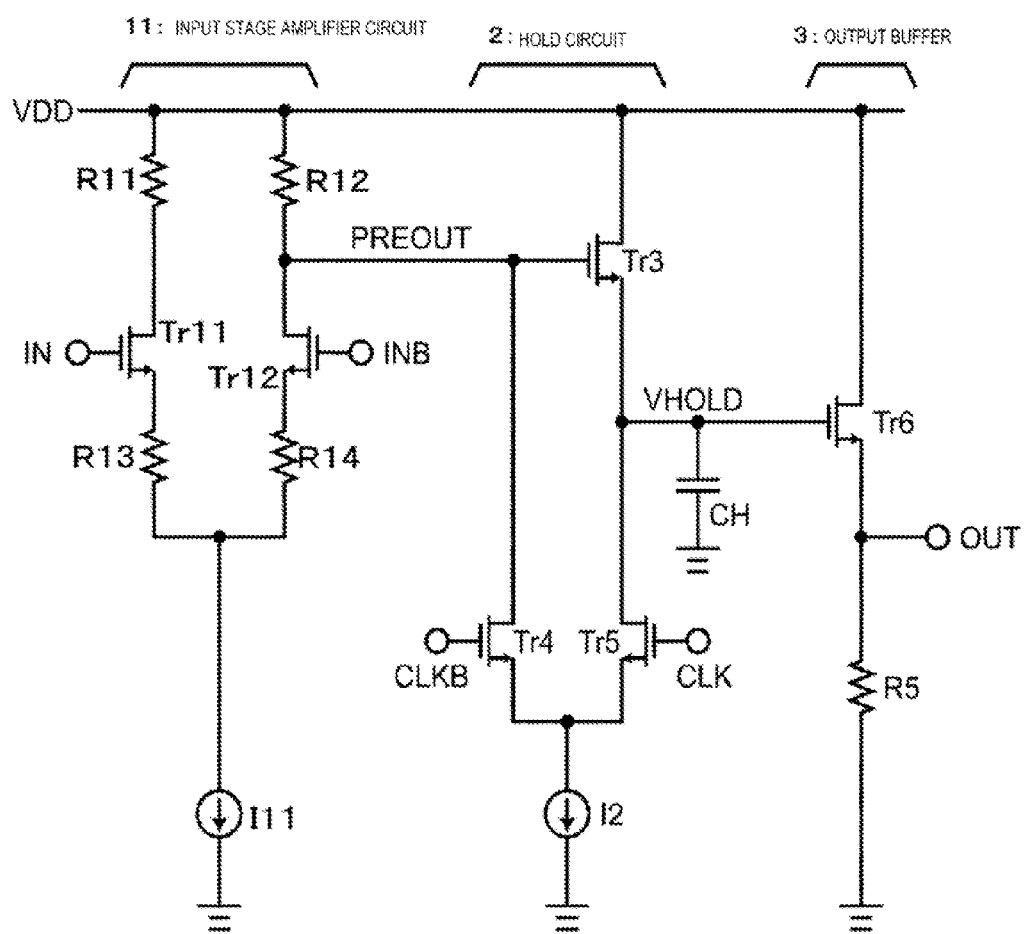
FIG. 6 is a circuit diagram of a sample and hold circuit of a first conventional example.
Figure 7:
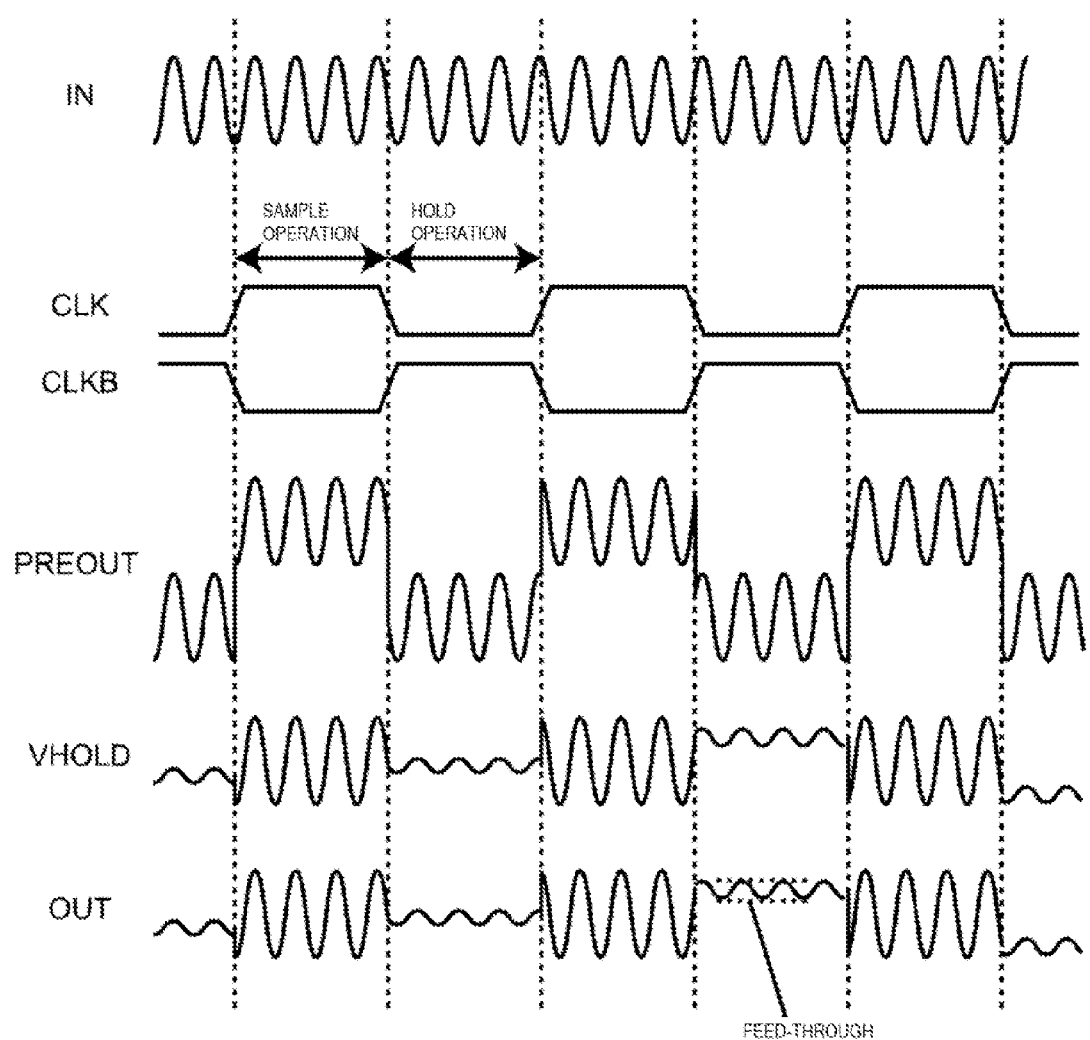
FIG. 7 is a timing chart of the sample and hold circuit of the first conventional example.
Figure 8:
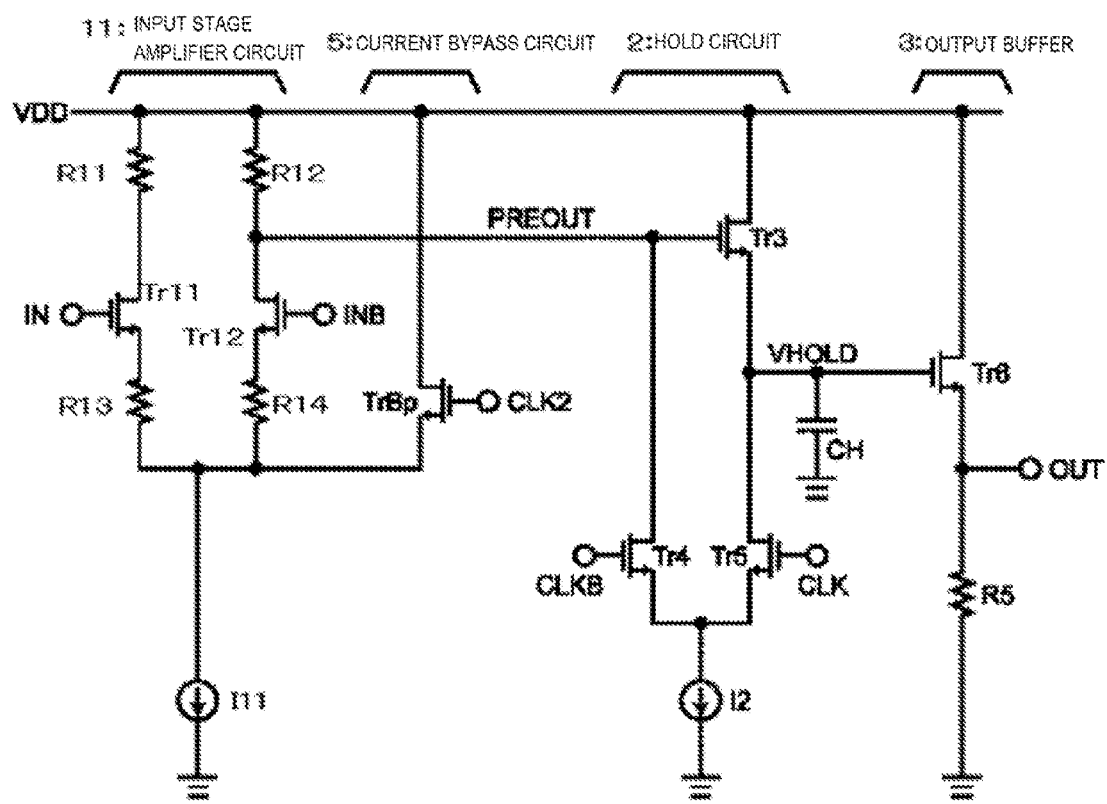
FIG. 8 is a circuit diagram of a sample and hold circuit of a second conventional example.

FIG. 4 is a circuit diagram of a sample and hold circuit according to a second exemplary embodiment of the present invention. Furthermore, a timing chart thereof is shown in FIG. 5. With regard to the sample and hold circuit of the present exemplary embodiment, two systems, system A and system B of a sample and hold circuit shown in the first exemplary embodiment are provided, and a time interleaving operation is performed by sampling clock signals having a phase relationship of mutually reversed phases. In addition, a single bias current source I1 common to input stage amplifier circuits and a single bias current source I2 common to hold circuits are respectively shared as bias current sources of the input stage amplifier circuits of the two sample and hold circuits and bias current sources of the hold circuits, and a configuration is such that an input stage bias current switching circuit 4 and a hold circuit bias current switching circuit 6 operate by switching in a time-wise manner. That is, when system A is in sample mode, system B is in hold mode, and when system A is in hold mode, system B is in sample mode, interleaving operations are alternately performed, and furthermore, a configuration is such that when system A is in a hold period, the common bias current sources I1 and I2 are used as a bias current of system B, and when system B is in a hold period, the common bias current sources I1 and I2 are used as a bias current of system A.

According to this type of sample and hold circuit, it is possible to effectively use a bias current, which conventionally has wasteful consumption, in another sample and hold circuit that performs an interleaving operation by sampling clock signals of reverse phase. Therefore, as a result of raising power efficiency, it is possible to realize a low-power time interleave type of sample and hold circuit.

Furthermore, in the abovementioned description, an example has been described in which two sample and hold circuits perform time interleaving operations. However, there is no limitation to this, and it is also possible for three or more sample and hold circuits to perform a time interleaving operation. In this case, by changing duty ratio of sampling clock signals CLK and CLKB in accordance with the number of sample and hold circuits, sharing of bias current is possible. Therefore, the more the number of interleaving operations is increased, the higher the power efficiency that can be realized.

Features of the sample and hold circuit of the present invention are summarized as follows.

(1) A sample and hold circuit formed of an input stage amplifier circuit for amplifying an input signal at a prescribed amplification rate, a hold circuit for receiving output of the input stage amplifier circuit and holding an output voltage of the input stage amplifier circuit with a sampling clock signal as a trigger, a voltage holding capacitor, connected to the hold circuit, for holding the output voltage, and an output buffer for buffering output of the hold circuit. The sample and hold circuit is further provided with an input stage bias current switching circuit, in which a bias current of the input stage amplifier circuit can be switched to a separate circuit; during a hold period in which the output voltage of the input stage amplifier circuit is held, the input stage amplifier circuit is turned OFF by switching the bias current of the input stage amplifier circuit to a separate circuit, to suppress leaking (feed-through) of an input signal to the output voltage; the switched bias current of the input stage amplifier circuit is supplied to the separate circuit, and in addition is provided with a hold circuit bias current switching circuit in which the bias current of the hold circuit can be switched to the separate circuit, and is characterized by supplying the bias current of the hold circuit during the hold period to the separate circuit.

(2) The sample and hold circuit as described in (1) above, wherein a plurality of sample and hold circuits are lined up, and sampling frequency being improved by making each of them perform a time interleaving operation, a single bias current source for an input stage amplifier circuit is shared as a bias current source of each of the input stage amplifier circuits that perform an interleaving operation, and the bias current is switched in a time-wise manner to be used as a bias current of each of the input stage amplifier circuits. In addition, the sample and hold circuit shares a single bias current source for a hold circuit as a bias current source of each of the hold circuits that perform an interleaving operation, and switch the bias current in a time-wise manner to be used as a bias current of each of the hold circuits.

(3) The sample and hold circuit as described in (1) above, wherein the input stage amplifier circuit is configured by an input stage differential amplifier circuit by a PMOS FET differential pair, the hold circuit being configured by a current switching source follower type hold circuit formed of a hold circuit bias current switching circuit in which an NMOS FET source follower and a bias current source thereof can be switched to a separate circuit by a NMOS FET differential pair, and the input stage bias current switching circuit being realized by a PMOS FET current switching differential pair arranged between the input stage differential amplifier circuit and the bias current source thereof.

(4) The sample and hold circuit described in (3) above has two systems of the sample and hold circuit, wherein when one thereof is in a sample period, a time interleaving operation is performed with the other in a hold period, one bias current source for an input stage differential amplifier circuit is shared by input stage differential amplifier circuits of the two sample and hold circuits, when the one thereof is in a hold period, a current is switched so as to flow a bias current to an input stage differential amplifier circuit of the other thereof, and furthermore, one bias current source for a hold circuit is shared by hold circuits of the two sample and hold circuits, and when one thereof is in a hold period, a current is switched so as to flow a bias current to a hold circuit of the other thereof.

Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according to the entire disclosure including the claims and to technological concepts thereof.

What is claimed is:
1. A device, comprising:
   a plurality of sample and hold circuits, each comprising:
      an input stage amplifier circuit that amplifies an input signal;
      a hold circuit that holds an output signal of said input stage amplifier circuit with a sampling clock signal as a trigger; and
      a first bias current switching circuit that switches a bias current of said hold circuit to a first other circuit that is functionally independent of said each sample and hold circuit, when said hold circuit is in a hold period, to supply said first other circuit;

wherein:
   each of said sample and hold circuits is made to perform a time interleaving operation;
   a single bias current source for a hold circuit is provided to be shared as a bias current source of each of said hold circuits that perform an interleaving operation; and
   said first bias current switching circuit switches a bias current of said bias current source for each said hold circuit in a time-wise manner, to supply said bias current as a bias current of each of said hold circuits.

2. The device according to claim 1, wherein
said hold circuit is configured by a source follower of a first conductive type transistor, and
said first bias current switching circuit is configured by a current switching differential pair of a first conductive type transistor arranged between said source follower and a bias current source thereof.

3. The device according to claim 2, wherein
two systems of said sample and hold circuit are provided, and when one of said two systems is in a sample period, a time interleaving operation is performed with another of said two systems in a hold period,
one bias current source for a hold circuit is provided to be shared by hold circuits of both of said sample and hold circuits, and
said first bias current switching circuit switches and supplies a current so as to flow a bias current to another hold circuit, when one system is in a hold period.

4. A sample and hold circuit comprising:
an input stage amplifier circuit that amplifies an input signal;
a hold circuit that holds an output signal of said input stage amplifier circuit with a sampling clock signal as a trigger;
a first bias current switching circuit that switches a bias current of said hold circuit to a first other circuit that is functionally independent of said sample and hold circuit, in a case where said hold circuit is in a hold period, to supply said circuit; and
a second bias current switching circuit that switches a bias current of said input stage amplifier circuit to a second other circuit that is functionally independent of said sample and hold circuit, when said hold circuit is in a hold period, to supply said second other circuit.

5. The sample and hold circuit according to claim 4, wherein
a plurality of said sample and hold circuits are provided;
each of said sample and hold circuits is made to perform a time interleaving operation, a single bias current source for an input stage amplifier circuit is provided to be shared as a bias current source of each of said input stage amplifier circuits that perform an interleaving operation, and a single bias current source for a hold circuit is provided to be shared as a bias current source of each of said hold circuits that perform an interleaving operation;
said first bias current switching circuit switches a bias current in a time-wise manner with respect to said bias current source for a hold circuit, to be supplied as a bias current of each of said hold circuits; and
said second bias current switching circuit switches a bias current in a time-wise manner with respect to said bias current source for an input stage amplifier circuit, to be supplied as a bias current of each of said input stage amplifier circuits.

6. The sample and hold circuit according to claim 4, wherein
said input stage amplifier circuit is configured by an input stage differential amplifier circuit by a differential pair of a second conductive type transistor,
said second bias current switching circuit is configured by a current switching differential pair of a second conductive type transistor arranged between said input stage differential amplifier circuit and a bias current source thereof,
said hold circuit is configured by a source follower of a first conductive type transistor, and
said first bias current switching circuit is configured by a current switching differential pair of a first conductive type transistor arranged between said source follower and a bias current source thereof.

7. The sample and hold circuit according to claim 6, wherein
two systems of said sample and hold circuit are provided, and when one of said two systems is in a sample period, a time interleaving operation is performed with another of said two systems in a hold period,
one bias current source for an input stage differential amplifier circuit is provided to be shared by input stage differential amplifier circuits of both of said sample and hold circuits,
said second bias current switching circuit switches and supplies a current so as to flow a bias current to another of said input stage differential amplifier circuits, when one of said systems is in a hold period,
one bias current source for a hold circuit is provided to be shared by hold circuits of both of said sample and hold circuits, and
a first bias current switching circuit switches and supplies a current so as to flow a bias current to another of said hold circuits, when one of said systems is in a hold period.

8. A method for controlling a sample and hold circuit, comprising:
that comprises an input stage amplifier circuit for amplifying an input signal and a hold circuit for holding an output signal of said input stage amplifier circuit with a sampling clock signal as a trigger;
performing control so as to switch a bias current of said hold circuit to a first other circuit that is functionally independent of said sample and hold circuit, in a case where said hold circuit is in a hold period, to supply said circuit
wherein control is performed so as to switch a bias current of said input stage amplifier circuit to a second other circuit that is functionally independent of said sample and hold circuit, in a case where said hold circuit is in a hold period, to supply said circuit.

* * * * *